United States Patent
Trivedi

(10) Patent No.: US 8,461,012 B2
(45) Date of Patent: Jun. 11, 2013

(54) DEVICE WITH GROUND PLANE FOR HIGH FREQUENCY SIGNAL TRANSMISSION AND METHOD THEREFOR

(75) Inventor: Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 200 days.

(21) Appl. No.: 12/714,104

(22) Filed: Feb. 26, 2010

(65) Prior Publication Data

US 2011/0210430 A1 Sep. 1, 2011

(51) Int. Cl.
*H01L 21/20* (2006.01)

(52) U.S. Cl.
USPC .......... 438/396; 257/259; 257/664; 257/665; 257/E21.004; 257/E21.006; 257/E21.021; 257/E21.577; 257/E21.579; 257/E21.585; 257/E21.593; 438/3; 438/238; 438/239; 438/240; 438/381; 438/390; 438/391; 438/397; 438/398; 438/399; 333/161; 333/172; 333/204; 333/236; 333/246; 327/525; 327/564; 327/565; 327/566

(58) Field of Classification Search
USPC .......... 257/259, 664, 665, E21.004, E21.006, 257/E21.021, E21.577, E21.579, E21.585, 257/E21.593; 333/12, 161, 172, 204, 236, 333/246, 250, 254, 260, 262, 505; 327/525, 327/564–566; 438/3, 238–240, 390–399, 438/381
See application file for complete search history.

(56) References Cited

U.S. PATENT DOCUMENTS 6,284,617 B1 * 9/2001 Erdeljac et al. ............... 438/381
2010/0213572 A1 * 8/2010 Ching et al. .................. 257/532

OTHER PUBLICATIONS

Avenier, G. et al.; "0.13um SiGe BiCMOS Technology for mm-Wave Applications"; IEEE BCTM 2008; 2008; pp. 89-92; IEEE.
Mangan, A. M. et al.; "De-Embedding Transmission Line Measurements for Accurate Modeling of IC Designs"; IEEE Transactions of Electron Devices; Feb. 2006; pp. 235-241; vol. 53, No. 2; IEEE.

* cited by examiner

*Primary Examiner* — Meiya Li
(74) *Attorney, Agent, or Firm* — James L. Clingan, Jr.; Joanna G. Chiu

(57) ABSTRACT

A method for forming a semiconductor structure includes forming an isolation region in a semiconductor substrate; forming a conductive layer over the isolation region; forming a first dielectric layer over the conductive layer; forming a plurality of conductive vias extending through the first dielectric layer to the conductive layer and electrically contacting the conductive layer; forming a second dielectric layer over the first dielectric layer; and forming a conductive ground plane in the second dielectric layer. Each of the plurality of conductive vias is in electrical contact with the conductive ground plane, and the conductive ground plane includes an opening, wherein the opening is located directly over the conductive layer. At least one interconnect layer may be formed over the second dielectric layer and may include a transmission line which transmits a signal having a frequency of at least 30 gigahertz.

15 Claims, 6 Drawing Sheets

DEVICE WITH GROUND PLANE FOR HIGH FREQUENCY SIGNAL TRANSMISSION AND METHOD THEREFOR

BACKGROUND

1. Field

This disclosure relates generally to device structures for high frequency signal transmission, and more specifically, to device structures for high frequency signal transmission having a ground plane.

2. Related Art

The frequency of high frequency device continues to increase which create issues not as significant prior to the increase in frequency. One example is the ground plane often used in high frequency circuits, and more specifically, in a microstrip transmission line which is used to transmit the high frequency signal to or from active circuitry. A solid ground plane is desirable but is not practical because of the need for chemical mechanical polishing (CMP) which is typically used in forming the ground plane. In order for the CMP to provide the desired function the ground plane cannot be solid but must have openings and these openings must be relatively large compared to the openings required just for interconnect. The degree to which the openings interfere with the desired functioning of the ground plane is related to the relationship between the wavelength and the size of the openings. Thus, with the openings being required to be of at least a particular size for proper CMP, an increase in frequency can reduce the effectiveness of the ground plane for that particular size.

Accordingly there is a need to improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a ground plane in a high frequency circuit has openings useful for chemical mechanical polishing (CMP) that are directly over isolation regions. Conductive patches extend from the isolation regions to the openings. The conductive patches are electrically connected to the ground plane adjacent to the perimeter of the openings. The patches are sufficiently larger than the openings for the contacts to make contact between the patches and the ground plane. The result is that the negative effects of the openings are substantially offset by the contacts and conductive patches. This is better understood by reference to the drawings and the following description.

The semiconductor substrate described herein can be any semiconductor material or combinations of materials, such as gallium arsenide, silicon germanium, silicon-on-insulator (SOI), silicon, monocrystalline silicon, the like, and combinations of the above.

Figure 1:
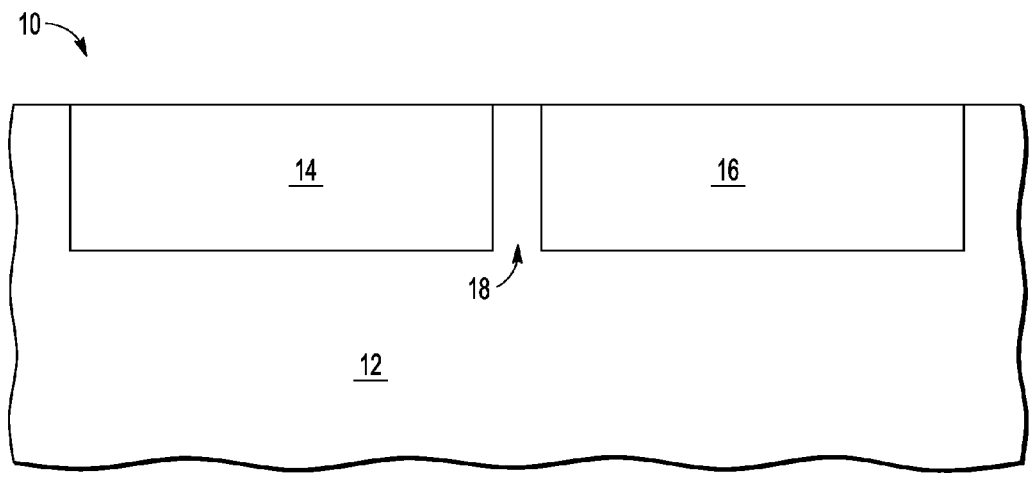
FIG. 1 is a cross section of a device structure at a stage in processing according to an embodiment.

Shown in FIG. 1 is a device structure 10 comprising a semiconductor substrate 12 having an isolation region 14, an isolation region 16, and an active region 18 between isolation regions 14 and 16. Isolation regions 14 and 16 may be made by conventional means and have a lateral dimension of about 5 microns and a depth of about 0.3 micron. These dimensions can vary widely. Isolation regions 14 and 16 may comprise silicon oxide.

Figure 2:
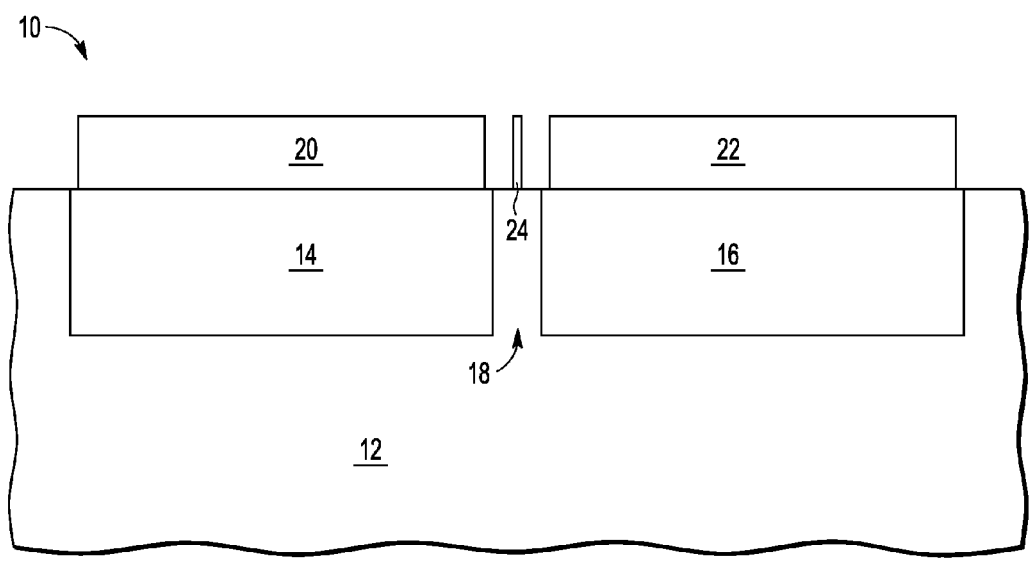
FIG. 2 is a cross section of the device structure of FIG. 1 at a subsequent stage in processing.

Shown in FIG. 2 is device structure 10 after forming a conductive layer and patterning it to form conductive layer 20, conductive layer 22, and a conductive layer 24 between conductive layer 20 and conductive layer 22. Conductive layer 24 is formed as for a typical gate over a gate dielectric layer (not shown) and may be called gate 24. Conductive layers 20, 22, and 24 may be about 0.2 micron in height. Conductive layers 20 and 22 are completely within isolation regions 14 and 16, respectively, in this example. Thus, conductive layers 20 and 22 are directly over isolation regions 14 and 16, respectively. Conductive layers 20, 22, and 24 may be doped polysilicon and the doping may be in situ during deposition or by implanting after deposition.

Figure 3:
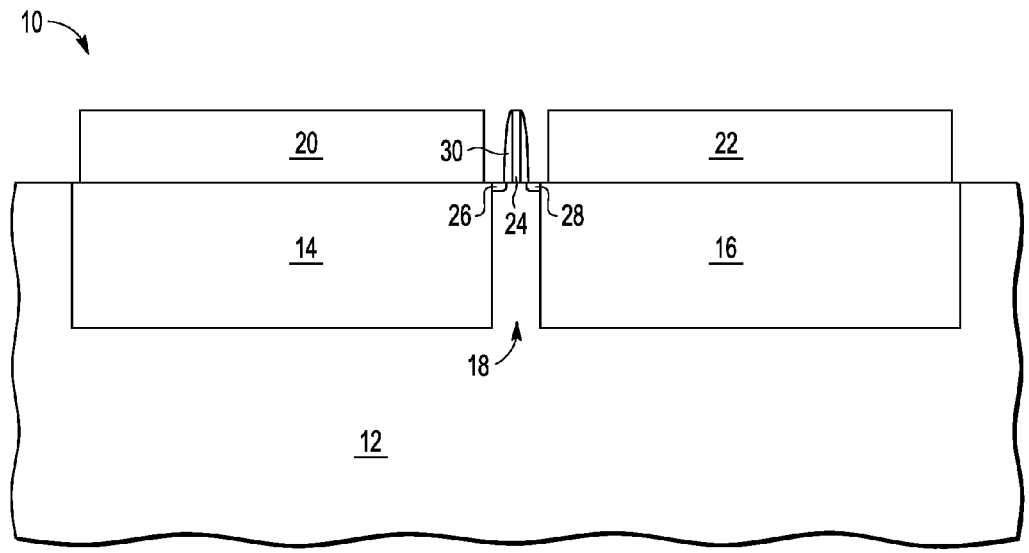
FIG. 3 is a cross section of the device structure of FIG. 2 at a subsequent stage in processing.

Shown in FIG. 3 is device structure 10 after sidewall spacer 30 has been formed around gate 24 and source/drain regions 26 and 28 formed adjacent to gate 24 which may be performed in conventional fashion. In this example, active region 18 is used to form a transistor that may be N channel or P channel. Active region 18 could be used to form a different type of active device or even a dummy device. Sidewall spacers (not shown to avoid cluttering the drawing) are also formed on the sidewalls of conductive layers 20 and 22 during the formation of sidewall spacer 30.

Figure 4:
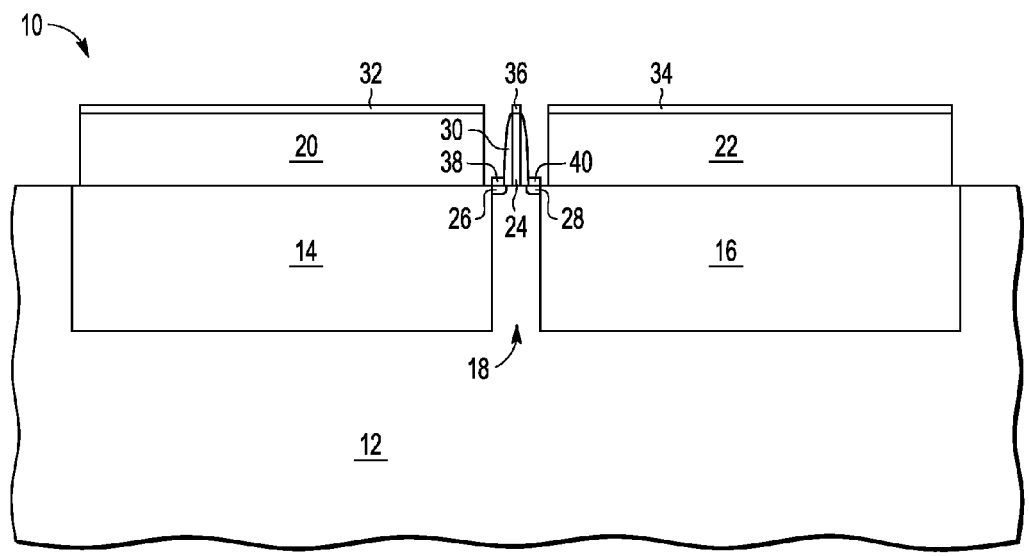
FIG. 4 is a cross section of the device structure of FIG. 3 at a subsequent stage in processing.

Shown in FIG. 4 is device structure 10 after forming silicide regions 32, 34, 36, 38, and 40 on conductive layer 20, conductive layer 22, gate 24, source/drain 26, and source/drain 28, respectively. This shows that silicide regions 32 and 34 may be formed conveniently while a conventional process forms silicide regions 36, 38, and 40.

Figure 5:
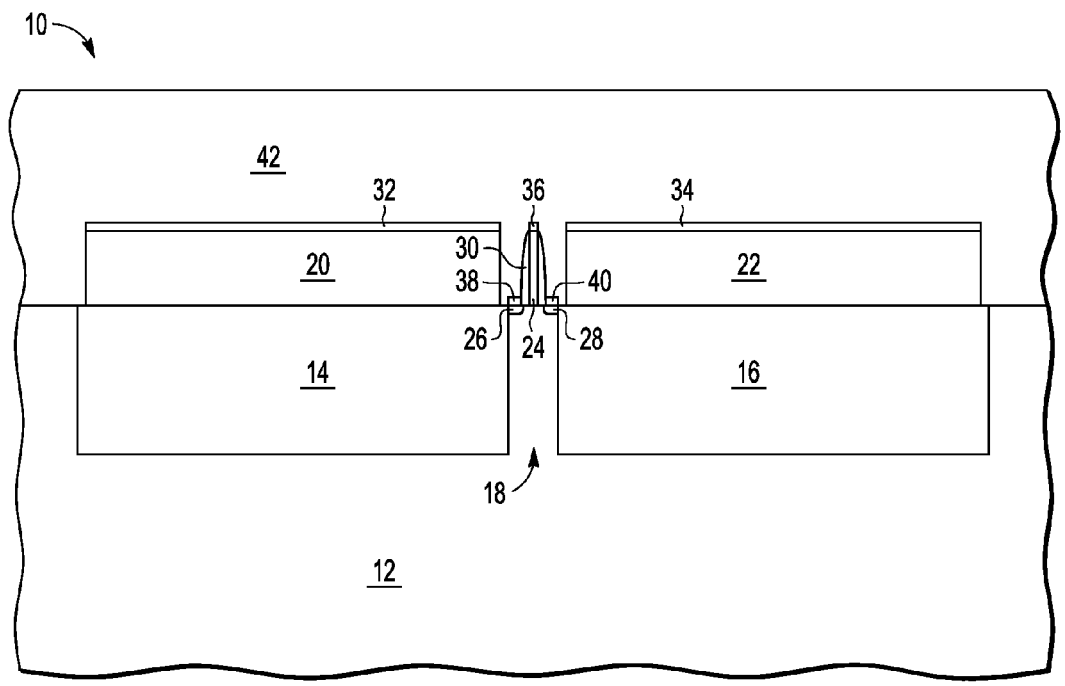
FIG. 5 is a cross section of the device structure of FIG. 4 at a subsequent stage in processing.

Shown in FIG. 5 is device structure 10 after an insulating layer 42 over conductive silicide regions 32, 34, 36, 38, and 40 which has the effect of being over isolation regions 14 and 16 and active region 18. Insulating layer 42, after CMP as shown in FIG. 5, has a thickness above silicide regions 32 and 34 of about 0.5 micron. Insulating layer 42 may be considered an interlayer dielectric (ILD) 42 or a dielectric layer. ILD 42 may be of oxide.

Figure 6:
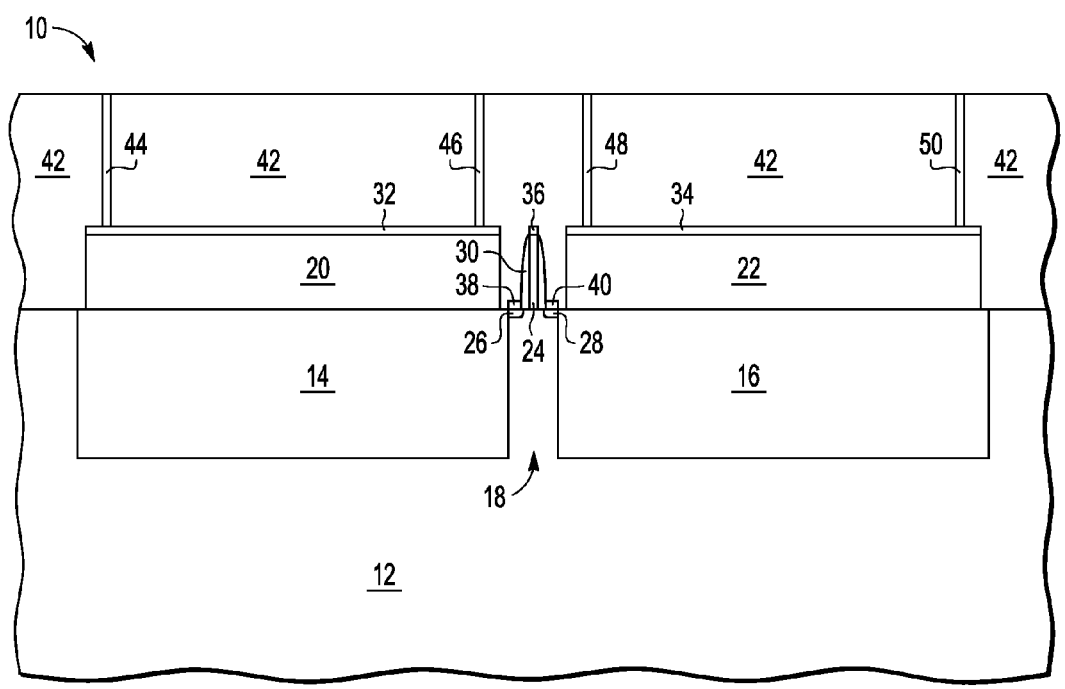
FIG. 6 is a cross section of the device structure of FIG. 5 at a subsequent stage in processing.

Shown in FIG. 6 is device structure 10 after forming contacts 44 and 46 through ILD 42 from a top surface of ILD 42 to silicide region 32 and contacts 48 and 50 through ILD 42 from a top surface of ILD 42 to silicide layer 34. Contacts 44, 46, 48, and 50 are exemplary contacts and may also be called conductive vias. Many more contacts contacting silicide regions 32 and 34 are formed but not shown in FIG. 6. Contacts 44, 46, 48, and 50 may be relatively large compared to typical contacts used to contact typical source/drains and gates.

Figure 7:
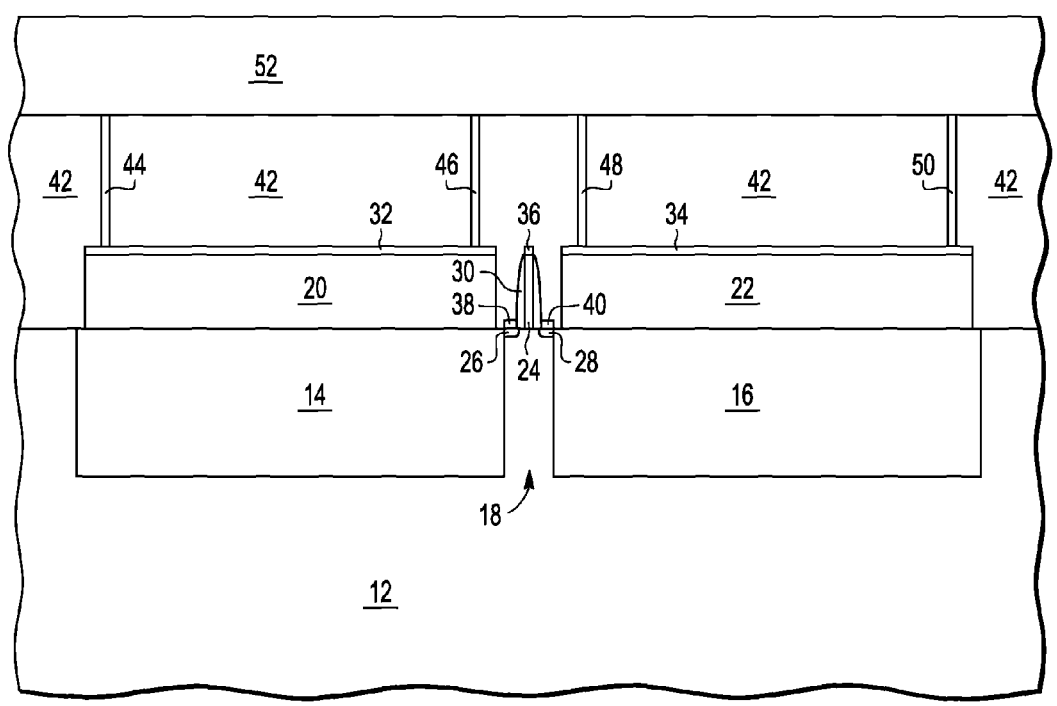
FIG. 7 is a cross section of the device structure of FIG. 6 at a subsequent stage in processing.

Shown in FIG. 7 is device structure 10 after forming an insulating layer 52 over ILD 42 and contacts 44, 46, 48, and 50. Insulating layer 52 may be oxide, may have a thickness of about 0.3 micron, and may called dielectric layer 52.

Figure 8:
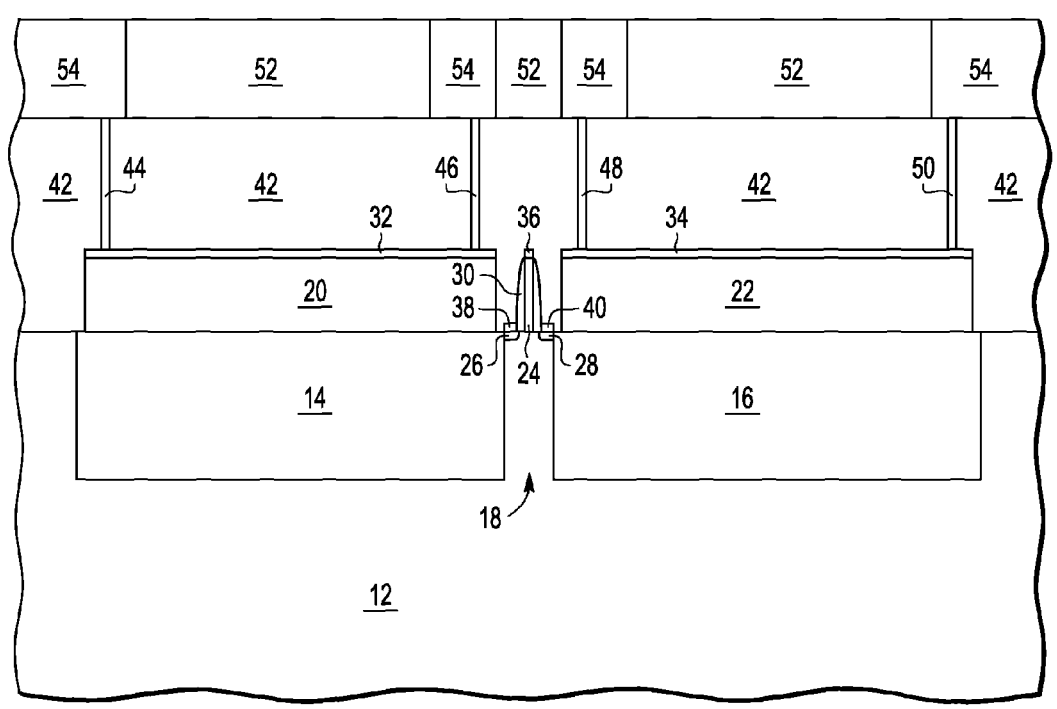
FIG. 8 is a cross section of the device structure of FIG. 7 at a subsequent stage in processing.

Shown in FIG. 8 is device structure 10 after forming a conductive layer 54 in insulating layer. In this case, conductive layer 54 may comprise copper. Conductive layer 54 may be formed in a conventional damascene process in which portions of insulating layer 52 are removed leaving trenches in insulating layer 52 to be filled with a conductive layer, preferably copper, deposited by plating followed by a CMP to remove any copper over the remaining insulating layer 52 and to planarize the top surface. The regions of insulating layer 52 remaining after the damascene process can be viewed as openings in the conductive layer which are filled with what remains of insulating layer 52. Conductive layer 54 has a function of being a ground plane and may be considered ground plane 54. Ground plane 54 has the described openings, which are where insulating layer 52 remains, and such openings, as shown in FIG. 8, are directly over conductive layers 20 and 22. Ground plane 54 is continuous but with openings such as the openings over conductive layers 20 and 22. There is also an opening in ground plane 54 which is where insulating layer 52 is over active region 18. Contacts 44 and 46 are two contacts among many more not shown in FIG. 8 that are along the perimeter of the opening directly over conductive layer 20. Similarly, contacts 48 and 50 are two contacts among many more not shown in FIG. 8 that are along the perimeter of the opening directly over conductive layer 22. This may be stated as, in a vertical direction to a major surface of conductive layer 22, a perimeter of the opening is fully encompassed by a boundary of the conductive layer.

Figure 9:
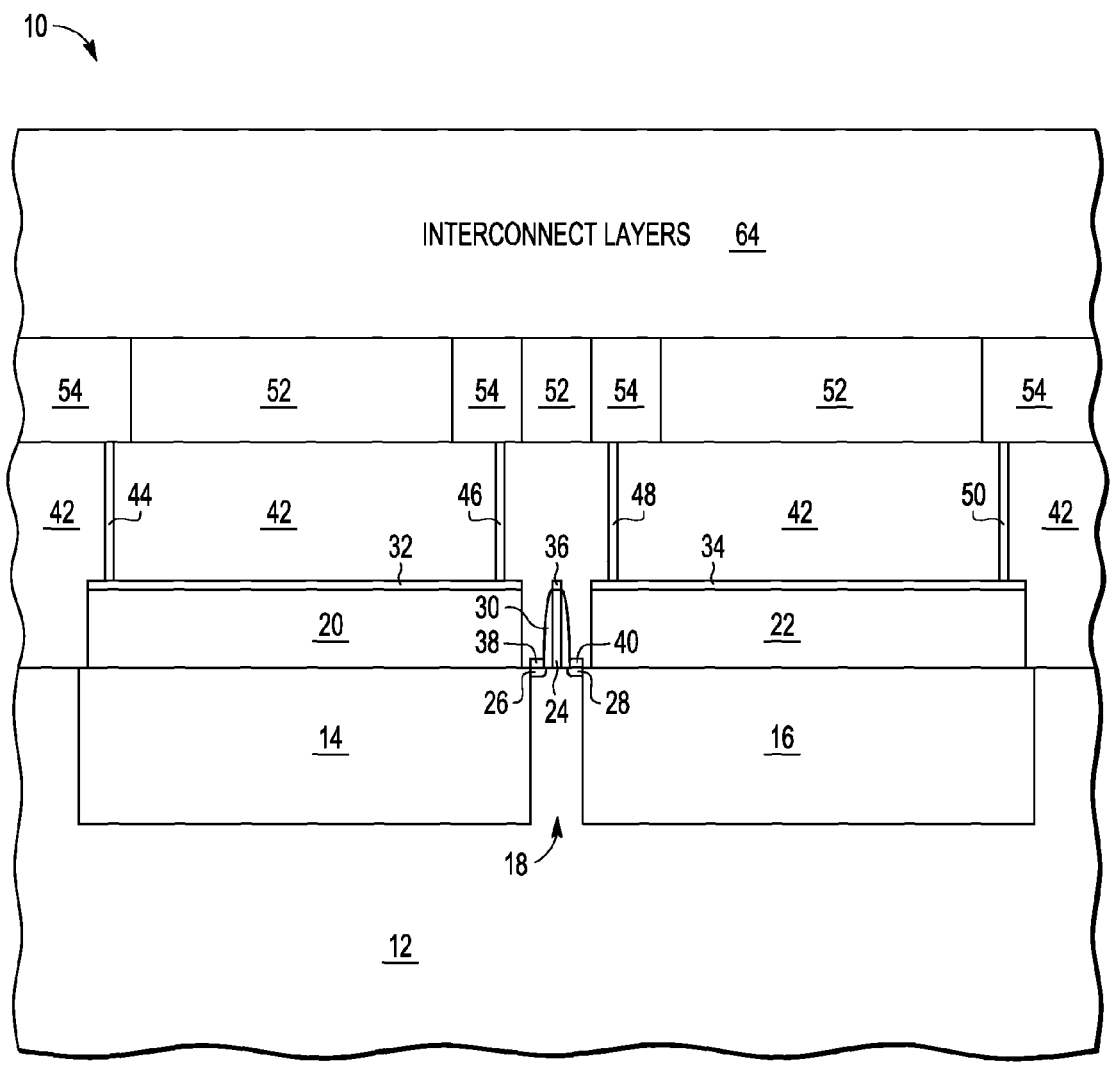
FIG. 9 is a cross section of the device structure of FIG. 8 at a subsequent stage in processing.

Shown in FIG. 9 is device structure 10 after forming interconnect layers 64 which may include five interconnect layers. The last layer of interconnect layers 64 is preferably the one that has the interconnect lines used for the highest frequency signals. Because of the high frequency, a frequency over 30 gigahertz, these interconnect lines that carry the high frequency signals, are modeled as transmission lines and thus may be called transmission lines. The transmission lines are in the last metal so as to be as far as possible from ground plane 54.

Figure 10:
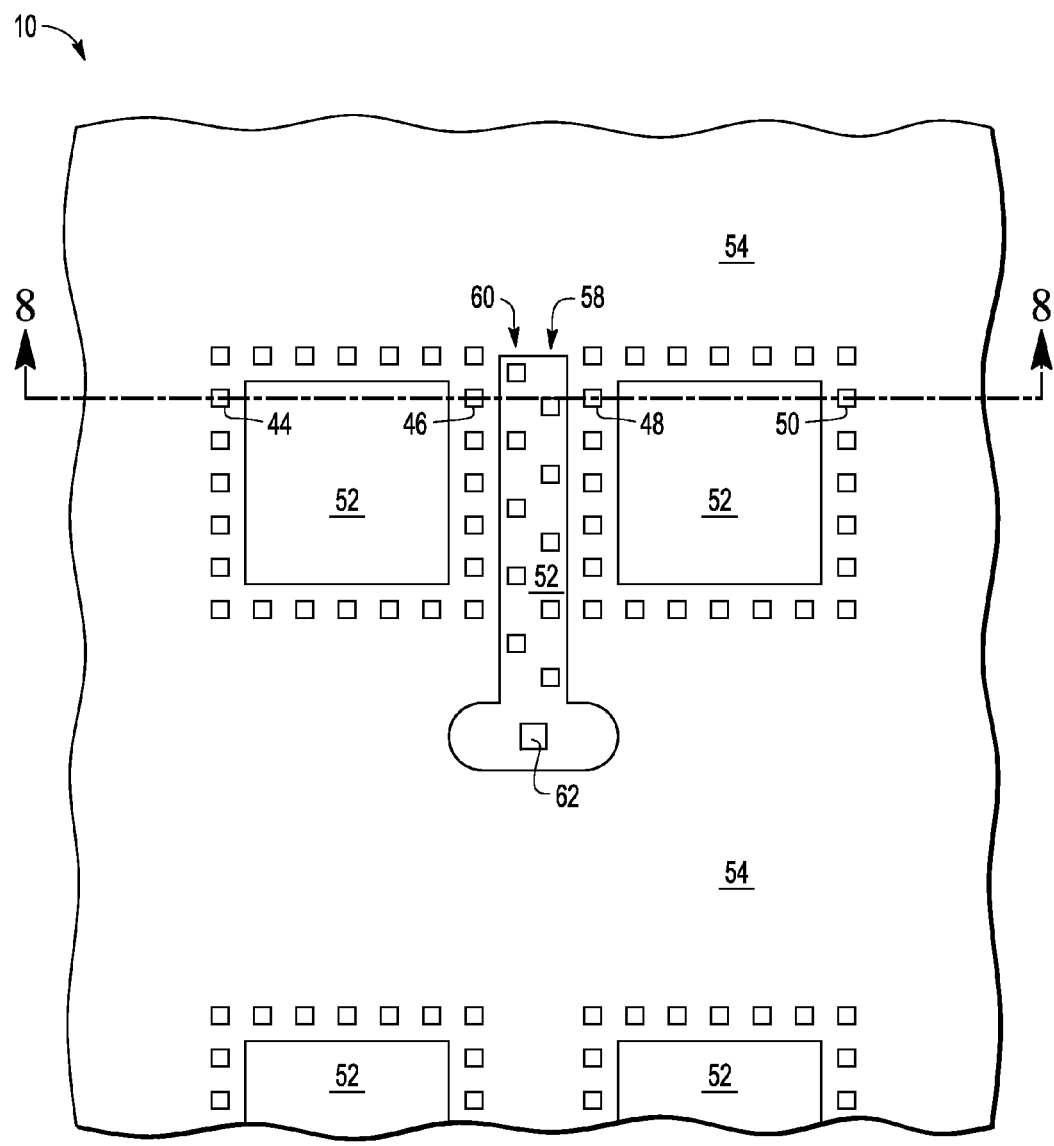
FIG. 10 is a top view of the device structure of FIG. 8.

Shown in FIG. 10 is a top view of device structure 10 of FIG. 8. showing the location of cross section 8-8 for FIG. 8. Also shown in FIG. 10 is the opening over active region 18 that has source/drain contacts 60, source/drain contacts 58, and a gate contact 62. FIG. 10 shows that many contacts are contacting ground plane 54 along the perimeter of the openings directly over conductive layers 20 and 22. The opening directly over conductive layer 20 is the one that includes contacts 44 and 46 along its perimeter. Similarly, the opening directly over conductive layer 22 is the one that includes contacts 48 and 50 along its perimeter. Two additional openings of the same type are partially shown also with contacts along the perimeter. These openings are the ones necessary for CMP and thus may be called CMP openings. The CMP openings are the ones that potentially cause a significant reduction in performance of the ground plane 54 at high frequencies and such reduction in performance degrades further with higher frequencies. This degradation is substantially reduced by the presence of conductive layers such as conductive layers 20 and 22 and the contacts connecting conductive layers 20 and 22 to ground plane 54 along the perimeters of the openings. The conductive layers and associated contacts appear to provide the necessary conduction across the CMP openings to avoid the major degradation in ground plane performance at high frequency caused by the CMP openings. Although the degradation caused by openings is understood to some extent, the degradation may occur at lower frequencies than previously believed for openings of about 3 microns. Thus the need for a solution to the degradation in ground plane performance at high frequency may be more urgent than previously believed.

By now it should be appreciated that there has been provided a method for forming a semiconductor structure. The method includes forming an isolation region in a semiconductor substrate. The method further includes forming a conductive layer over the isolation region. The method further includes forming a first dielectric layer over the conductive layer. The method further includes forming a plurality of conductive vias extending through the first dielectric layer to the conductive layer and electrically contacting the conductive layer. The method further includes forming a second dielectric layer over the first dielectric layer. The method further includes forming a conductive ground plane in the second dielectric layer, wherein each of the plurality of conductive vias is in electrical contact with the conductive ground plane, the conductive ground plane comprising an opening, wherein the opening is located directly over the conductive layer. The method may have a further characterization by which, in a vertical direction perpendicular to a major surface of the conductive layer, a perimeter of the opening is fully encompassed by a boundary of the conductive layer. The method may have a further characterization by which the conductive ground plane comprises a metal and the conductive layer comprises polysilicon. The method may further comprise forming at least one interconnect layer over the second dielectric layer and conductive ground plane, wherein the at least one interconnect layer comprises at least one transmission line which transmits a signal to or from active circuitry located in and over the semiconductor substrate adjacent the isolation region, wherein the signal has a frequency of at least 30 gigahertz. The method may further comprise forming a transistor in and over the semiconductor substrate, adjacent the isolation region, wherein the transistor comprises a gate dielectric over the semiconductor substrate, a gate electrode over the gate dielectric, a first source/drain region in the semiconductor substrate and adjacent the gate electrode, and a second source/drain region in the semiconductor substrate and adjacent the gate electrode. The method may have a further characterization by which the forming the transistor comprises forming the gate electrode over the gate dielectric, wherein the gate electrode is formed simultaneously with the conductive layer. The method may have a further characterization by which the conductive layer and the gate electrode each comprises polysilicon. The method may further comprise forming a first silicide region over the conductive layer, wherein the plurality of conductive vias are in electrical contact with the conductive layer via the first silicide region and forming a second silicide region over the first and second source/drain regions and the gate electrode, wherein the first silicide region and the second silicide region are formed simultaneously. The method may have a further characterization by which the conductive ground plane comprises a second opening, wherein a perimeter of the second opening fully surrounds the transistor. The method may further comprise forming at least one interconnect layer over the second dielectric layer and conductive ground plane and forming a contact which electrically contacts at least one of the gate electrode, the first source/drain region, or the second source/drain region, wherein the contact extends through the second opening to electrically contact the at least one interconnect layer. The method may further comprise forming a silicide region over the conductive layer, wherein the plurality of conductive vias are in electrical contact with the conductive layer via the silicide region.

Also disclosed is a method for forming a semiconductor structure. The method includes forming an isolation region in a semiconductor substrate. The method further includes forming a conductive layer over the isolation region, wherein the conductive layer comprises a polysilicon-containing layer over the isolation region and a silicide layer over the polysilicon-containing layer, and wherein a boundary of the isolation region fully surrounds a boundary of the conductive layer. The method further includes forming a first dielectric layer over the conductive layer. The method further includes forming a plurality of conductive vias extending through the first dielectric layer to the silicide layer. The method further includes forming a second dielectric layer over the first dielectric layer. The method further includes forming a metal-containing conductive ground plane in the second dielectric layer, wherein the metal-containing conductive ground plane is continuous, each of the plurality of conductive vias is in electrical contact with the metal-containing conductive ground plane, and the metal-containing conductive ground plane comprising an opening, wherein, in a vertical direction perpendicular to a major surface of the conductive layer, a perimeter of the opening is fully encompassed by a boundary of the conductive layer. The method may further comprise forming a transistor in and over the semiconductor substrate, adjacent the isolation region, wherein the transistor comprises a gate dielectric over the semiconductor substrate, a polysilicon-containing gate electrode over the gate dielectric, a first source/drain region in the semiconductor substrate and adjacent the gate electrode, and a second source/drain region in the semiconductor substrate and adjacent the gate electrode. The forming the transistor may comprise forming the polysilicon-containing gate electrode over the gate dielectric, wherein the polysilicon-containing gate electrode is formed simultaneously with the polysilicon-containing layer of the conductive layer. The method may further comprise forming silicide regions over the first and second source/drain regions and the gate electrode, wherein the silicide regions are formed simultaneously with the silicide layer of the conductive layer. The method may have a further characterization by which the metal-containing conductive ground plane comprises a second opening, wherein a perimeter of the second opening fully surrounds the transistor and the method further comprises forming at least one interconnect layer over the second dielectric layer and metal-containing conductive ground plane and forming a contact which electrically contacts at least one of the gate electrode, the first source/drain region, or the second source/drain region, wherein the contact extends through the second opening to electrically contact the at least one interconnect layer. The method may further comprise forming at least one interconnect layer over the second dielectric layer and metal-containing conductive ground plane, wherein the at least one interconnect layer comprises at least one transmission line which transmits a signal to or from active circuitry located in and over the semiconductor substrate adjacent the isolation region, wherein the signal has a frequency of a least 30 gigahertz.

Disclosed also is a semiconductor structure. The semiconductor structure includes a semiconductor substrate having an isolation region. The semiconductor structure further includes a conductive layer over the isolation region, wherein a boundary of the isolation region fully surrounds a boundary of the conductive layer. The semiconductor structure further includes a first dielectric layer over the conductive layer. The semiconductor structure further includes a plurality of conductive vias extending through the first dielectric layer to the conductive layer and electrically contacting the conductive layer. The semiconductor structure further includes a second dielectric layer over the first dielectric layer. The semiconductor structure further includes a conductive ground plane in the second dielectric layer, wherein each of the plurality of conductive vias is in electrical contact with the conductive ground plane, and the conductive ground plan comprises an opening, wherein the opening is located directly over the conductive layer, and a perimeter of the opening is fully encompassed by the boundary of the conductive layer. The semiconductor structure may further comprise active circuitry in and over the semiconductor substrate, adjacent the isolation region, wherein the conductive ground plane comprises a second opening, wherein a perimeter of the second opening surrounds the active circuitry. The semiconductor structure may further comprise at least one interconnect layer over the second dielectric layer and conductive ground plane, wherein the at least one interconnect layer comprises at least one transmission line which transmits a signal to or from the active circuitry, wherein the signal has a frequency of a least 30 gigahertz, and wherein at least one contact extends through the second opening to electrically connect the active circuitry to the at least one transmission line.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example different materials may be used than those set forth. For example, doped polysilicon is described for use as conductive layers 20 and 22, but another conductive material may also be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method for forming a semiconductor structure, the method comprising:

forming a first isolation region and a second isolation region in a semiconductor substrate;

forming a first conductive layer over the first isolation region and a second conductive layer over the second isolation region;

forming a first dielectric layer over the first conductive layer and the second conductive layer;

forming a first plurality of conductive vias extending through the first dielectric layer to the first conductive layer and electrically contacting the first conductive layer and a second plurality of conductive vias extending through the first dielectric layer to the second conductive layer and electrically contacting the second conductive layer;

forming a second dielectric layer over the first dielectric layer;

removing portions of the second dielectric layer to leave a first portion of the second dielectric layer over the first conductive layer and a second portion of the second dielectric layer over second conductive layer; and forming a conductive ground plane from a third conductive layer, using chemical mechanical processing (CMP), around the first portion of the second dielectric layer, around the second portion of the second dielectric layer, on and in electrical contact with the first plurality of conductive vias, and on and in electrical contact with the second plurality of conductive vias, wherein the CMP removes all of the third conductive layer that is over the first portion of the second dielectric layer and all of the third conductive layer that is over the second portion of the second dielectric layer and provides a planar top surface of the ground plane.

2. The method of claim 1, wherein the conductive ground plane comprises a metal and the first conductive layer comprises polysilicon.

3. The method of claim 1, further comprising:
forming at least one interconnect layer over the second dielectric layer and conductive ground plane, wherein the at least one interconnect layer, wherein the signal has a frequency of at least 30 gigahertz.

4. The method of claim 1, further comprising:
forming a transistor in and over the semiconductor substrate, between the first isolation region and the second isolation region, wherein the transistor comprises a gate over the semiconductor substrate, a first source/drain region in the semiconductor substrate and adjacent the gate electrode, and a second source/drain region in the semiconductor substrate and adjacent the gate electrode.

5. The method of claim 4, wherein the forming the transistor comprises:
forming the gate electrode simultaneously with the conductive layer.

6. The method of claim 5, wherein the first conductive layer and the gate electrode each comprises polysilicon.

7. The method of claim 4, further comprising:
forming a first silicide region over the first conductive layer, wherein the first plurality of conductive vias are in electrical contact with the first conductive layer via the first silicide region; and
forming a second silicide region over the first and second source/drain regions and the gate electrode, wherein the first silicide region and the second silicide region are formed simultaneously.

8. The method of claim 4, further comprising:
forming at least one interconnect layer over the second dielectric layer and conductive ground plane; and forming a contact which electrically contacts at least one of the gate electrode, the first source/drain region, or the second source/drain region, wherein the contact extends through a third portion of the second dielectric layer to electrically contact the at least one interconnect layer.

9. The method of claim 1, further comprising:
forming a silicide region over the first conductive layer, wherein the first plurality of conductive vias are in electrical contact with the first conductive layer via the silicide region.

10. A method for forming a semiconductor structure, the method comprising:
forming a first isolation region and a second isolation region in a semiconductor substrate;

forming a first conductive layer over the first isolation region and a second conductive layer over the second isolation region, wherein the first conductive layer comprises a first polysilicon-containing layer over the first isolation region and a first silicide layer over the first polysilicon-containing layer and the second conductive layer comprises a second polysilicon-containing layer over the second isolation region and a second silicide layer over the second polysilicon-containing layer;

forming a first dielectric layer over the first conductive layer and the second conductive layer;

forming a first plurality of conductive vias extending through the first dielectric layer to the second silicide layer and a second plurality of vias extending through the first dielectric layer to the second silicide layer;

forming a second dielectric layer over the first dielectric layer;

removing portions of the second dielectric layer to leave a first portion of the second dielectric layer over the first conductive layer and a second portion of the second dielectric layer over second conductive layer and to expose the first plurality of conductive vias and the second plurality of conductive vias; and forming a metal-containing conductive ground plane from a third conductive layer around the first portion of the second dielectric layer and the second portion of the second dielectric layer using chemical mechanical polishing (CMP), wherein:
the metal-containing conductive ground plane is continuous and has a planar top surface; and
the first plurality of conductive vias and the second plurality of conductive vias are in electrical contact with the metal-containing conductive ground plane by the metal-containing conductive ground plane being on the first plurality of conductive vias and the second plurality of conductive vias.

11. The method of claim 10, further comprising:
forming a transistor in and over the semiconductor substrate, between the first isolation region and the second isolation region, wherein the transistor comprises a polysilicon-containing gate over the semiconductor substrate, a first source/drain region in the semiconductor substrate and adjacent the polysilicon-containing gate, and a second source/drain region in the semiconductor substrate and adjacent the polysilicon-containing gate.

12. The method of claim 11, wherein the forming the transistor comprises:
forming the polysilicon-containing gate simultaneously with the polysilicon-containing layer of the conductive layer.

13. The method of claim 11, further comprising:
forming silicide regions over the first and second source/drain regions and the polysilicon-containing gate, wherein the silicide regions are formed simultaneously with the silicide layer of the conductive layer.

14. The method of claim 11, comprising:

forming at least one interconnect layer over the second dielectric layer and metal-containing conductive ground plane; and forming a contact which electrically contacts at least one of the gate electrode, the first source/drain region, or the second source/drain region, wherein the contact extends through the second dielectric layer to electrically contact the at least one interconnect layer.

15. The method of claim 10, further comprising:

forming at least one interconnect layer over the second dielectric layer and metal-containing conductive ground plane, wherein the at least one interconnect layer transmits a signal, wherein the signal has a frequency of a least 30 gigahertz.

* * * * *

UNITED STATES PATENT AND TRADEMARK OFFICE
CERTIFICATE OF CORRECTION

PATENT NO. : 8,461,012 B2  
APPLICATION NO. : 12/714104  
DATED : June 11, 2013  
INVENTOR(S) : Vishal P. Trivedi Page 1 of 1

It is certified that error appears in the above-identified patent and that said Letters Patent is hereby corrected as shown below:

In the Claims

Column 9, line 3: "The method of claim 11 comprising:" should be --The method of claim 11 further comprising:--

Signed and Sealed this  
Eighteenth Day of March, 2014

Michelle K. Lee  
*Deputy Director of the United States Patent and Trademark Office*